United States Patent
Lu

(10) Patent No.: US 9,971,045 B2
(45) Date of Patent: May 15, 2018

(54) MEMORY WITH ENHANCEMENT TO PERFORM RADIATION MEASUREMENT

(71) Applicant: INTEL CORPORATION, Santa Clara, CA (US)

(72) Inventor: Shih-Lien Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 14/979,922

(22) Filed: Dec. 28, 2015

(65) Prior Publication Data

US 2017/0184733 A1 Jun. 29, 2017

(51) Int. Cl.
*G01T 1/24* (2006.01)
*G11C 11/417* (2006.01)

(52) U.S. Cl.
CPC ............ *G01T 1/245* (2013.01); *G11C 11/417* (2013.01)

(58) Field of Classification Search
CPC .................................. G01T 1/24; G01T 1/245
USPC ..................................................... 250/370.14
See application file for complete search history.

(56) References Cited

U.S. PATENT DOCUMENTS

| 7,779,216 B2 | 8/2010 | Souders et al. |
| 8,724,421 B2 * | 5/2014 | Evans ....................... G06F 1/10 365/226 |
| 8,934,314 B2 * | 1/2015 | Taufique ............... G11C 11/417 365/202 |
| 8,981,491 B1 | 3/2015 | Hart et al. |
| 2007/0271421 A1 | 11/2007 | Kim et al. |
| 2015/0138887 A1 | 5/2015 | Kay et al. |
| 2015/0186275 A1 | 7/2015 | Moga et al. |

FOREIGN PATENT DOCUMENTS

WO    2007137012 A1    11/2007

OTHER PUBLICATIONS

Notification of Transmittal of the International Search Report and the Written Opinion of the International Searching Authority issued for International Patent Application No. PCT/US2016/056659, dated Jan. 20, 2017.
Slayman, Charles, "Soft Error Trends and Mitigation Techniques in Memory Devices", Presentation, Ops A La Carte LLC, Jan. 2011, 27 pages.
Uemura, Taiki, "Soft-Error in SRAM at Ultra-Low Voltage and Impact of Secondary Proton in Terrestrial Environment" IEEE On Nuclear Science, vol. 60, No. 6, Dec. 2013, pp. 4047-4051.

* cited by examiner

*Primary Examiner* — David Porta
*Assistant Examiner* — Meenakshi Sahu
(74) *Attorney, Agent, or Firm* — Compass IP Law PC

(57) ABSTRACT

Techniques are described that includes using a memory to store data within a system. The techniques include lowering a supply voltage applied to said memory and ceasing use of the memory to store data within the system. The techniques further include reading values from the memory with the supply voltage being lowered. The techniques further include determining a radiation level from an amount of corrupted ones of the values.

20 Claims, 4 Drawing Sheets

MEMORY WITH ENHANCEMENT TO PERFORM RADIATION MEASUREMENT

FIELD OF USE

The field of invention pertains generally to computing systems and, more specifically, to a memory with an enhancement to perform a radiation measurement.

BACKGROUND

With the ability to integrate large numbers of transistors on a single semiconductor die, engineers strive to design these transistors in various ways to enhance the applications and/or functions of the systems and/or circuits that the transistors are a constituent part of.

FIGURES

A better understanding of the present invention can be obtained from the following detailed description in conjunction with the following drawings, in which.

DETAILED DESCRIPTION

Various embodiments provide at least a radiation measurement techniques where the radiation detection capability is built into circuitry of a system. That is, no special Geiger counter device is used, rather, the nominal circuitry of the system is designed to be sensitive to changes in radiation levels and to incorporate such sensitivity into actual radiation measurement functionality.

Figure 1:
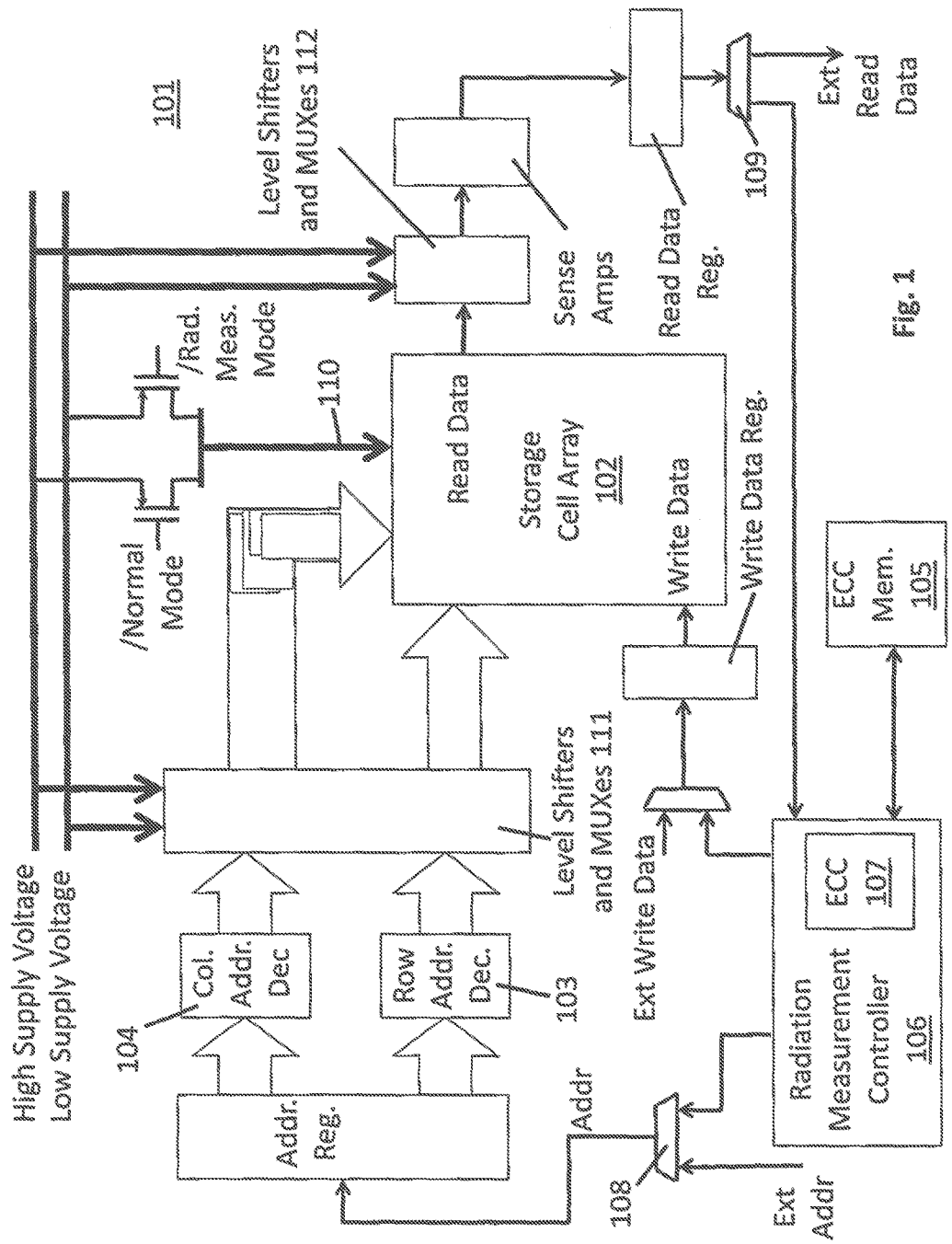
FIG. 1 shows a memory that is enhanced to perform a radiation measurement.

FIG. 1 shows an embodiment where a memory circuit of a computer is used not only as a standard component of a computing system but is also specially designed to detect radiation levels. As observed in FIG. 1, a memory 100 includes an array of storage cells 102, row address decoder circuitry 103 and column address decoder circuitry 104. During normal operation of the computer system, the memory 101 is used for its normal function. For instance, the array of storage cells 101 may be implemented as an array of static random access memory (SRAM) cells that behave as a cache or a buffer within the computing system.

As just one possibility, computing systems typically comprise a digital signal processor (DSP) for executing program code related to audio and/or video functions. The DSP is typically coupled to a large static random access memory (SRAM) for keeping/buffering data items that the DSP has, is and/or will be processing. Thus, in various embodiments, the DSP buffer SRAM within a computing system is additionally designed with appropriate logic to implement a radiation measurement as described below.

During normal operation of the computing system, data to be buffered/cached is written into the storage cell cell array 102 and buffered/cached data is read from the storage cell array 102. During normal operation of the memory 101 each of the row and column address decoders 103, 104 and the storage cell array 102 receive a normal supply voltage level (e.g., 1.8V, 1.3V) that is commonly applied to other circuitry within the system.

However, the power supply line 110 that is provided to the storage cell array 102 is multiplexed through power transistors between the higher normal supply voltage and a lower supply voltage (e.g., 0.75V) that is used during the radiation measurement. As described in more detail further below, in an embodiment, when a radiation measurement mode is entered, the lower supply voltage is provided to the memory cell array 102 rather than the higher supply voltage.

Here, as is known in the art, when, e.g., an SRAM cell is placed in a radioactive environment, data cells within the SRAM cell will "flip" or otherwise become corrupted in response to being irradiated. Additionally, the SRAM cells are particularly susceptible to radiation induced bit flips if the supply voltage of the storage cells is low. During the radiation measurement mode, data is read from the memory cell array 102 while it is supplied with the lower supply voltage. Any corrupted data is identified. The total amount of corrupted data after numerous reads is correlated to an amount of radiation which is then reported as the measured radiation level.

Figure 2:
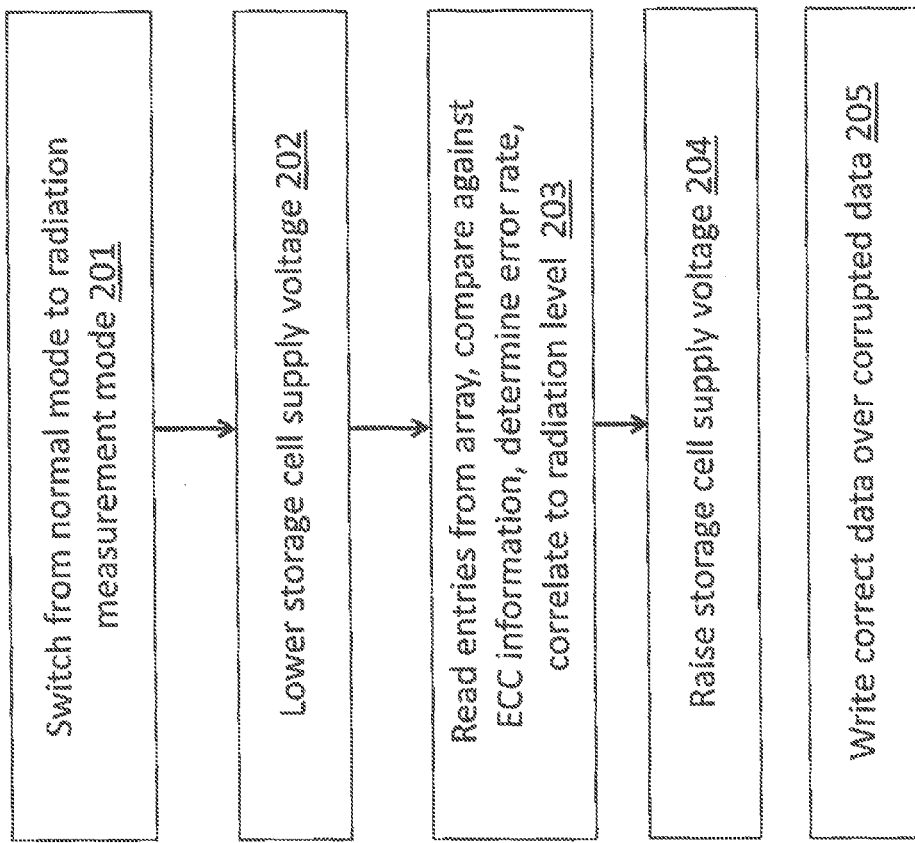
FIG. 2 shows a methodology for performing a radiation measurement.

FIG. 2 shows an embodiment of a complete process whereby a radiation mode is first entered, a radiation measurement is made and then the radiation mode is departed from so that the system may resume normal use of the memory. As observed in FIG. 2, the memory is switched from normal mode to radiation measurement mode 201. When radiation measurement mode is entered, the system is prevented from using the memory 101 for its normal use. For example, if the memory is used as a cache or buffer, the system is prevented from writing normal system data into the cache/buffer and reading normal system data from the cache/buffer. The existing data remains in the memory, however. As will be described in more detail further below, if any of the existing data within the memory becomes corrupted during the radiation measurement, it will automatically be restored during the transition back to normal mode from radiation mode.

After the radiation mode is entered, referring to FIGS. 1 and 2, the supply voltage on the memory is lowered 202. However, depending on implementation, it is possible that some form of error correction code (ECC) information generation (and perhaps storage of the generated ECC information) may be performed after the radiation mode is entered 201 and before the supply voltage on the memory is lowered 202.

The precise manner as to how ECC information is utilized in the radiation mode may vary from embodiment to embodiment. As is known in the art, the "signature" of a data entry that is kept in a memory is referred to as a "codeword" that is composed of the actual random/customer data and the ECC information that is associated with the actual random/customer data. Here, as will be described in more detail immediately below, it is possible that a data entry may be corrupted during the radiation measurement and ECC information is used to restore the data entry back to its correct value as part of the transition back to normal mode from radiation mode.

The amount of ECC information that is associated with each of the data entries that are kept in the storage cell array 102 as part of the normal usage of the storage cell 102 and the amount of ECC information that is used for these same data entries during the radiation measurement may vary from embodiment to embodiment.

At one extreme, all the ECC information that is needed to restore a data entry that becomes corrupted during radiation mode is kept in the storage cell array 102 (or some other storage cell array) as part of normal system operation. Here, for example, if storage cell array 102 is normally used as a cache or a buffer, the cache or buffer is designed to keep ECC data for the cached/buffered entries in storage cell array 102 during normal usage. In this particular extreme, if the normal ECC data kept for each entry is sufficient to restore the data of those entries that become corrupted by the radiation measurement, no special ECC calculation activity needs to transpire upon entrance into the radiation measurement mode 201. Rather, the ECC entries that already exist in the storage cell array 102 are read out and used to restore a data entry if the entry becomes corrupted during the radiation measurement.

By contrast, at another extreme, the storage cell array 102 (or any other storage array) does not keep any ECC information during normal operating mode.. In this other extreme, ECC information needs to be calculated for the entries in the storage cell array 102 as part of the process of entering the radiation measurement mode. The freshly calculated ECC values may be stored in memory 105 after their respective calculation. Here, the radiation mode controller 106 may include associated ECC calculation logic 107 that is responsible for calculating the ECC information.

Somewhere between these two extremes, the storage cell array 102 keeps some ECC data for its entries but the amount of ECC data may not be enough to recover from the (potentially more extensive) data corruption that may occur during the radiation measurement. As such, the radiation measurement controller 106 calculates additional or larger ECC information fields for the entries within the storage cell array 102 and stores the enhanced ECC information into memory 105. The enhanced ECC information may include normal ECC information that is read from the storage cell array 102 that is appended with additional ECC information, or, entirely new, larger ECC data fields may be calculated and stored in memory 105.

Thus, after any additional ECC information is stored in memory 105 (if any), the supply voltage of the storage cell array 102 is lowered 202. Here, as observed in FIG. 1, a pair of power transistors are coupled to the power supply rail 110 of the storage cell array 102 to enable selection between the higher supply voltage during normal mode and the lower supply voltage during the radiation measurement mode. Thus to lower the supply voltage on the storage cell array 102, the power transistor that is coupled to the lower supply voltage is turned on and the power transistor that is coupled to the higher supply voltage is turned off.

For simplicity, FIG. 1 suggests that the entire storage cell array 102 is subjected to the lower supply voltage during the radiation measurement. Although this is a possible design option, in other embodiments, only a subset of the storage cells are of a storage cell array are subjected to the lower voltage radiation measurement. In this case, only the cells that participate in the radiation measurement are coupled to the lower supply voltage during the radiation measurement mode. For simplicity the remainder of the discussion will assume that the entire storage cell array 102 participates in the radiation measurement.

With the supply voltage to the storage cell array 101 being lowered, if the memory 101 is subjected to radiation, bits of data entries within the storage cell array 102 will begin to flip. Here, again, storage cells are more susceptible to radiation induced errors when a lower supply voltage is applied to them.

After a sufficient exposure time has elapsed, the entries of the storage cell array 102 are read and the ECC information for these same entries (which may be kept entirely in the storage cell array 105, entirely stored in memory 105 or some combination of both) is used to detect whether the data that has just been read has been corrupted or not. Thus, ECC logic 107 may not only include an ECC generation part (if additional ECC information is to be calculated for entries as part of entry in radiation mode) but also includes an error checking part. If the data has been corrupted, the error count is added to a total error count that is tabulated for the measurement. After all entries that are subjected to the lower voltage have been tested a total error count for the measurement can be determined.

In an embodiment, the radiation measurement controller switches the channel select input of a first multiplexer 108 that selects between an externally generated address (used during normal mode) and an address generated by the radiation measurement controller 106 during the radiation measurement. Here, in order to read out the entries of the storage cell array, the radiation measurement controller 106, e.g., scrolls through the set of addresses for the array 102 and causes them to be applied to the array 102 in a read mode. Likewise, the radiation measurement controller switches the channel select input of a second multiplexer 109 that selects between directing read data externally from the memory 101, or, internally back to the radiation measurement controller 106 for comparison against its corresponding ECC information.

After the set of entries within the storage cell array 102 have been read from the array and compared against their corresponding ECC information, the radiation measurement controller 106 determines a total error count or error rate that is correlated to a radiation amount 204 which, e.g., is determined in advance through empirical evidence. Here, the precise manner in which a specific amount of radiation correlates to a specific memory's error rate is a function of the specific manufacturing technology used to fabricate the memory. A definitive correlation can be established however between a specific amount of radiation and an error rate at a particular lowered voltage for any memory technology.

In various embodiments, more than one sweep of reads may be made through the array 102 to, e.g., essentially extend the radiation exposure time so as to capture more errors and produce a more accurate measurement result.

Note that FIG. 1 depicts the presence of multiplexed level shifting circuitry 111 between the row and column address decoders 103, 104 and the storage cell array 102 to permit the storage cell array 102 to be accessed with higher voltages during both the normal (high) supply voltage mode and with lower voltages during the radiation measurement (low) supply voltage mode.

Figure 3:
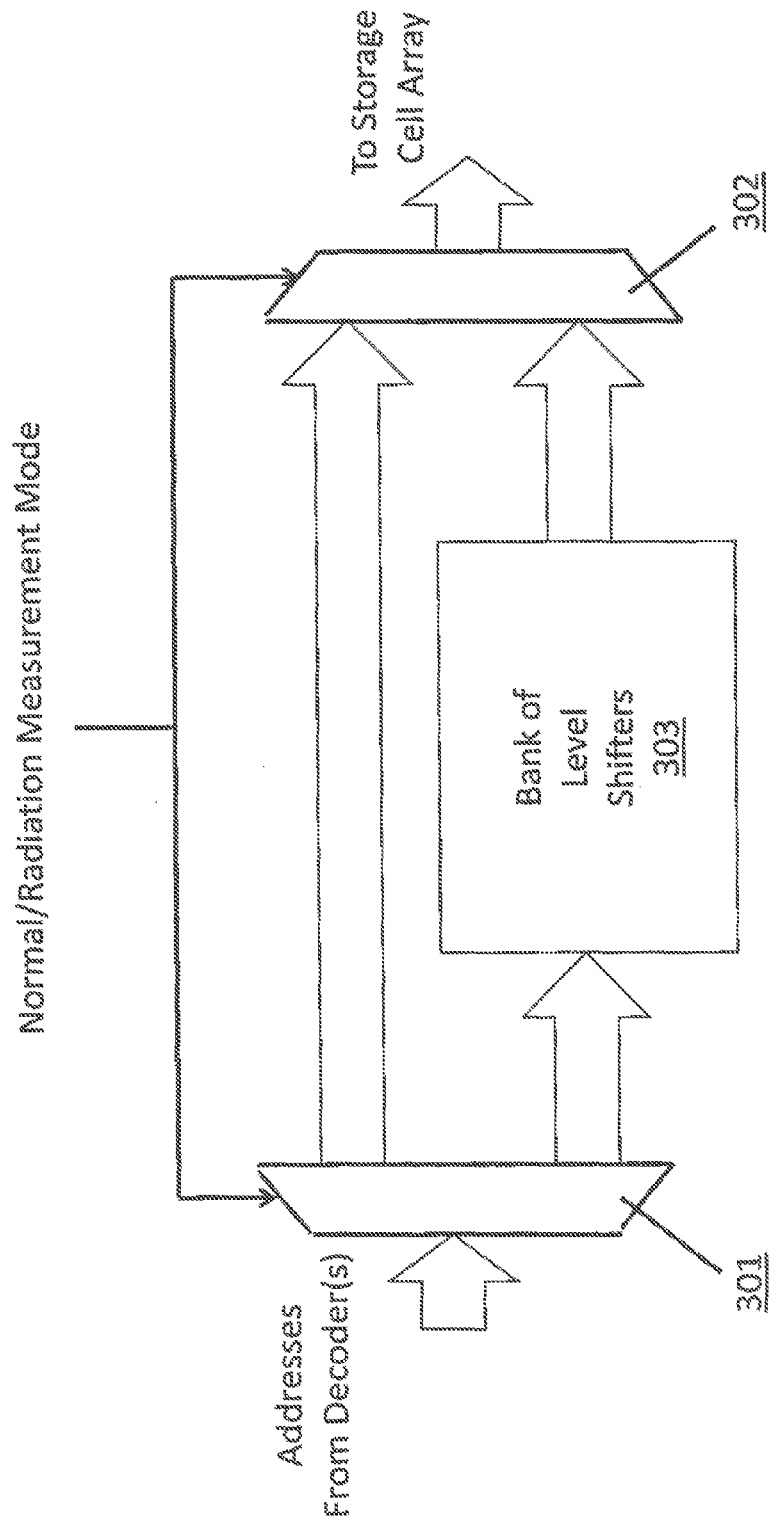
FIG. 3 shows a set of channels one of which includes level shifting.

FIG. 3 shows a depiction of the row and/or column address bus as handled by the multiplexers and level shifters 111 of FIG. 1. Referring to FIG. 3, during normal mode, respective multiplexers 301, 302 are configured to let the normal signals from the decoders pass directly to the array. However, during radiation measurement mode, the multiplexers 301, 302 are configured to pass these same signals through level shifting circuitry 303 so as to drop the signal voltage levels from a high level as emitted by the decoders to a low level for application to the array having the low supply voltage.

Although FIG. 1 depicts the multiplexers and level shifters 111 as being between the decoders 103, 104 and the storage cell array 102, potentially, the multiplexers and level shifters 111 could be located deeper within the array 102 or farther out from the array (e.g., at the inputs to the decoders 103, 104 instead of at the outputs from the decoders). Note also that another set of multiplexers and level shifters 112, similar to the design of FIG. 3, is used to treat read data differently depending on which the mode the memory 101 is in. In normal mode, read signals are passed directly without any level conversion. By contrast, in radiation measurement mode, read signals are level shifted up from a lower voltage level to a higher voltage level for subsequent processing by the radiation measurement controller.

After a level of radiation has been determined 203, the memory is prepared for system for normal operation. Here, the supply level of the array is raised 204 to the normal voltage level by turning off the power transistor that is coupled to the lower supply voltage and turning on the power transistor that is coupled to the higher supply voltage. With the higher supply voltage being applied to the storage array 102, the level shifting channels within circuits 111 and 112 are de-selected and the straight-through channels are selected to effectively disable any level shifting activity along the address and data channels.

Finally, any data entry read from the storage array 102 during the radiation measurement mode that was recorded as having been corrupted by the radiation measurement is written back 205 into the array 102 with the correct data. Here, the ECC data that is used for the entries during the radiation measurement are not only used to detect a corrupted error during the radiation measurement, but are also used to correct any corrupted data back to its original correct form before resumption of the normal mode. After all corrupted entries are over-written into the storage array 102 with their correct respective data content, the system is returned to normal mode and the array is permitted to be used again for its normal purpose (e.g., a cache or buffer) within the system.

It is worthwhile to note that the act of lowering a supply voltage to a storage cell array may inherently result in a higher bit error rate even in the absence of any radiation. That is, for example, if data entries are read out at a normal supply voltage and then the same entries are again read out when a lower supply voltage is applied to the storage cells, the lower supply voltage read outs may exhibit errors even if no radiation is present. In an embodiment, the intrinsic induced error rate that results solely from a lower supply voltage without radiation is accounted for when making a radiation measurement.

For example, a baseline low voltage error rate in the absence of radiation may be measured for the storage cell array 102 and kept in a non volatile storage element (not shown) that is coupled to the radiation measurement controller 106. During the radiation measurement, the radiation measurement controller 106 effectively subtracts out errors induced solely by the lowered supply voltage leaving errors induced solely by the radiation. The later errors are then used to determine the radiation level.

Although the memory 101 can be any type of memory that will exhibit errors in the face of radiation, e.g., SRAM or even dynamic random access memory (DRAM) or a non volatile random access memory (e.g., FLASH, a phase change memory, etc.), it is worthwhile to point out that SRAM storage cells are known to exhibit higher error rates in the face of radiation than DRAM storage cells and therefore may be a better candidate technology for memory 101.

When reporting a radiation level measurement result, in an embodiment, the radiation measurement controller 106 writes to a register (not shown) or, e.g., a reserved area of BIOS or system memory.

The radiation measurement controller 106 may be implemented as dedicated and/or programmed custom logic hardware (e.g., a finite state machine circuit) designed to implement the radiation control functionality, or, a controller or a processor that executes program code (such as firmware or software) to implement the radiation control function, or any combination of hardware and firmware/software.

FIG. 5 shows a depiction of an exemplary computing system 500 such as a personal computing system (e.g., desktop or laptop) or a mobile or handheld computing system such as a tablet device or smartphone, or, a larger computing system such as a server computing system. The computing system may include a radiation measurement function as described above where a memory within the system corresponds to the aforementioned memory 101.

Figure 4:
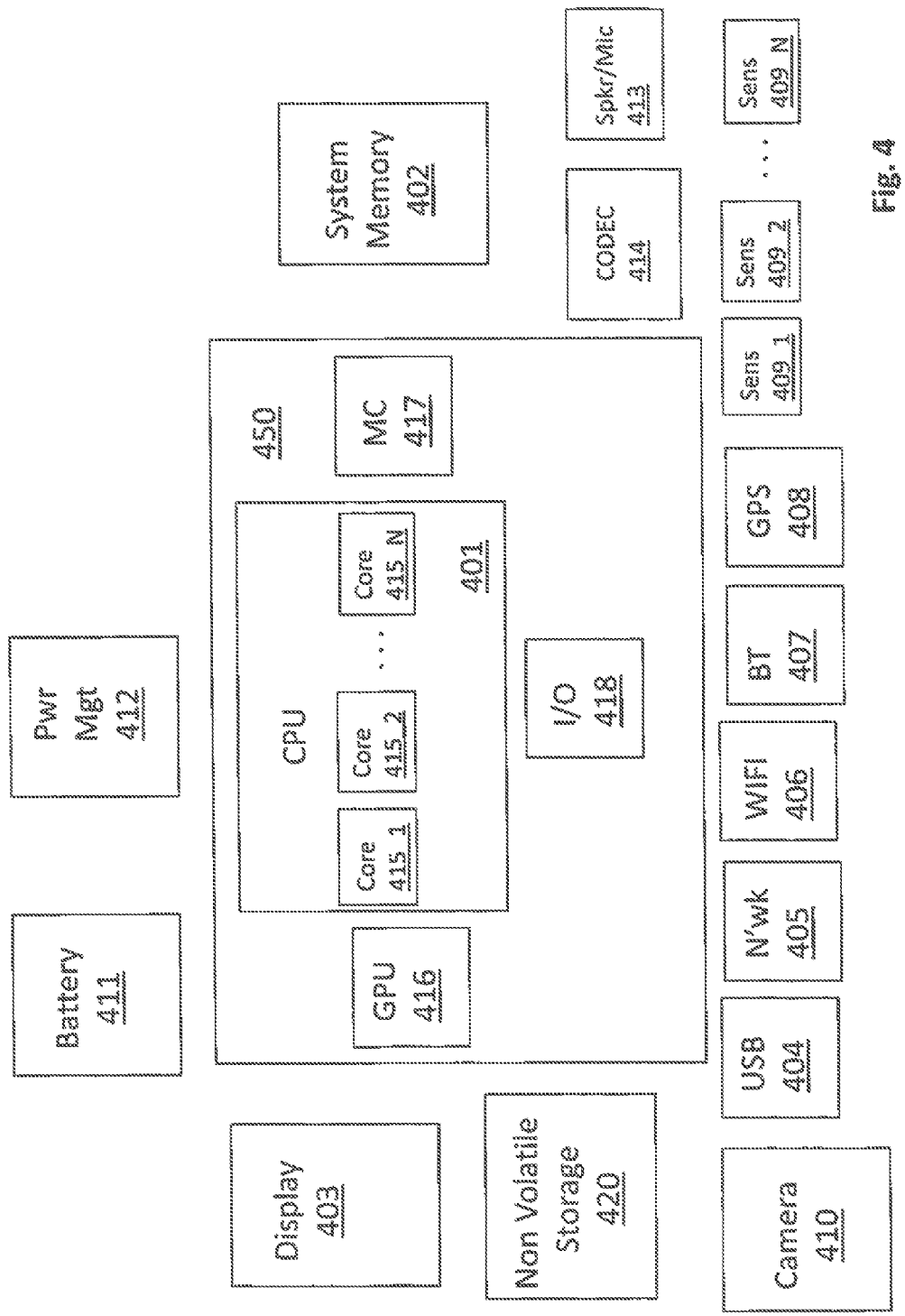
FIG. 4 shows a computing system.

As observed in FIG. 4, the basic computing system may include a central processing unit 401 (which may include, e.g., a plurality of general purpose processing cores and a main memory controller disposed on an applications processor or multi-core processor), system memory 402, a display 403 (e.g., touchscreen, flat-panel), a local wired point-to-point link (e.g., USB) interface 404, various network I/O functions 405 (such as an Ethernet interface and/or cellular modem subsystem), a wireless local area network (e.g., WiFi) interface 406, a wireless point-to-point link (e.g., Bluetooth) interface 407 and a Global Positioning System interface 408, various sensors 409_1 through 409_N (e.g., one or more of a gyroscope, an accelerometer, a magnetometer, a temperature sensor, a pressure sensor, a humidity sensor, etc.), a camera 410, a battery 411, a power management control unit 412, a speaker and microphone 413 and an audio coder/decoder 414.

An applications processor or multi-core processor 450 may include one or more general purpose processing cores 415 within its CPU 401, one or more graphical processing units 416, a memory management function 417 (e.g., a memory controller) and an I/O control function 418. The general purpose processing cores 415 typically execute the operating system and application software of the computing system. The graphics processing units 416 typically execute graphics intensive functions to, e.g., generate graphics information that is presented on the display 403. The memory control function 417 interfaces with the system memory 402. The system memory 402 may be a multi-level system memory.

Each of the touchscreen display 403, the communication interfaces 404-407, the GPS interface 408, the sensors 409, the camera 410, and the speaker/microphone codec 413, 414 all can be viewed as various forms of I/O (input and/or output) relative to the overall computing system including, where appropriate, an integrated peripheral device as well (e.g., the camera 410). Depending on implementation, various ones of these I/O components may be integrated on the applications processor/multi-core processor 450 or may be located off the die or outside the package of the applications processor/multi-core processor 450.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
    a storage cell array comprising a plurality of storage cells, said plurality of storage cells coupled to a power supply rail, said power supply rail coupled to a higher supply voltage node and a lower supply voltage node through a power switching circuit, said power switching circuit to couple said lower supply voltage node to said storage cell array during a radiation measurement mode and to couple said higher supply voltage node to said storage cell array during a normal mode, said storage cell array to store data of a system during said normal mode; and,
    a radiation measurement controller to determine a radiation level during said radiation measurement mode by analysis of corrupt data of said storage cell array.

2. The apparatus of claim 1 further comprising a memory coupled to said radiation measurement controller to store error code correction (ECC) values for data stored in said storage cell array.

3. The apparatus of claim 2 wherein said radiation measurement controller is to over-write said corrupt data in said storage cell array with correct information.

4. The apparatus of claim 1 wherein said radiation measurement controller is to generate address values for application to said storage cell during said radiation measurement mode.

5. The apparatus of claim 1 further comprising level-shifting circuitry to convert higher voltage level signals to lower level voltage signals for application to said storage cell array during said radiation measurement mode.

6. The apparatus of claim 1 wherein said storage cell array is implemented as a buffer within said system during said normal mode.

7. The apparatus of claim 1 wherein said storage cell array is implemented as a cache within said system during said normal mode.

8. The apparatus of claim 1 wherein said storage cell array comprises static random access memory (SRAM) storage cell array.

9. A computing system, comprising:
    a plurality of processing cores;
    a memory controller coupled to the plurality of processing cores;
    a system memory coupled to the memory controller;
    a display;
    a storage cell array comprising a plurality of storage cells, said plurality of storage cells coupled to a power supply rail, said power supply rail coupled to a higher supply voltage node and a lower supply voltage node through a power switching circuit, said power switching circuit to couple said lower supply voltage node to said storage cell array during a radiation measurement mode and to couple said higher supply voltage node to said storage cell array during a normal mode, said storage cell array to store data of a system during said normal mode; and,
    a radiation measurement controller to determine a radiation level during said radiation measurement mode by analysis of corrupt data of said storage cell array.

10. The computing system of claim 9 further comprising a memory coupled to said radiation measurement controller to store ECC values for data stored in said storage cell array.

11. The computing system of claim 9 wherein said radiation measurement controller is to over-write said corrupt data in said storage cell array with correct information.

12. The computing system of claim 9 wherein said radiation measurement controller is to generate address values for application to said storage cell during said radiation measurement mode.

13. The computing system of claim 9 further comprising level-shifting circuitry to convert higher voltage level signals to lower level voltage signals for application to said storage cell array during said radiation measurement mode.

14. The computing system of claim 9 wherein said storage cell array is implemented as a buffer within said system during said normal mode.

15. The computing system of claim 9 wherein said storage cell array is implemented as a cache within said system during said normal mode.

16. The computing system of claim 9 wherein said storage cell array comprises an SRAM storage cell array.

17. The computing system of claim 9, further comprising one or more of:
    a battery communicatively coupled to one or more of the plurality of processing cores or
    a network interface communicatively coupled to one or more of the plurality of processing cores.

18. A method, comprising:
    using a memory to store data within a system;
    lowering a supply voltage applied to said memory and ceasing use of said memory to store data within said system;
    reading values from said memory with said supply voltage being lowered; and,
    determining a radiation level from an amount of corrupted ones of said values.

19. The method of claim 18 further comprising over-writing said corrupted ones of said values with correct data determined from pre-stored ECC information.

20. The method of claim 19 further comprising raising said supply voltage to a normal level after said over-writing.

* * * * *